United States Patent
Minetani

(10) Patent No.: US 6,787,821 B2
(45) Date of Patent: Sep. 7, 2004

(54) COMPOUND SEMICONDUCTOR DEVICE HAVING A MESFET THAT RAISES THE MAXIMUM MUTUAL CONDUCTANCE AND CHANGES THE MUTUAL CONDUCTANCE

(75) Inventor: Keiji Minetani, Nakakoma (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/893,477

(22) Filed: Jun. 29, 2001

(65) Prior Publication Data

US 2002/0008249 A1 Jan. 24, 2002

(30) Foreign Application Priority Data

Jul. 19, 2000 (JP) ........................................ 2000-219108

(51) Int. Cl.[7] ................. H01L 31/0328; H01L 31/0336; H01L 31/072; H01L 31/109
(52) U.S. Cl. ........................ 257/194; 257/191; 257/197; 257/198; 257/475
(58) Field of Search ................................ 257/197, 198, 257/475, 191, 194

(56) References Cited

U.S. PATENT DOCUMENTS

| | | | | |
|---|---|---|---|---|
| 5,206,527 A | * | 4/1993 | Kuwata | 257/191 |
| 5,321,278 A | * | 6/1994 | Nakagawa | 257/192 |
| 5,331,410 A | * | 7/1994 | Kuwata | 257/192 |
| 5,349,201 A | * | 9/1994 | Stanchina et al. | 257/18 |
| 5,350,936 A | * | 9/1994 | Ikalainen et al. | 257/194 |
| 5,371,387 A | | 12/1994 | Ando | |
| 5,373,168 A | * | 12/1994 | Ando et al. | 257/24 |
| 5,412,230 A | | 5/1995 | Nakagawa | |
| 5,477,066 A | * | 12/1995 | Nakanishi | 257/197 |
| 5,652,440 A | * | 7/1997 | Chang | 257/194 |
| 5,719,415 A | * | 2/1998 | Yagura et al. | 257/191 |
| 5,773,853 A | * | 6/1998 | Saito | 257/192 |
| 5,780,879 A | * | 7/1998 | Unozawa | 257/192 |
| 5,837,565 A | * | 11/1998 | Kuroda et al. | 438/172 |
| 5,903,018 A | * | 5/1999 | Shimawaki | 257/198 |

FOREIGN PATENT DOCUMENTS

| | | |
|---|---|---|
| JP | 63-272080 | 11/1988 |
| JP | 64-2371 | 1/1989 |
| JP | 64-074764 | 3/1989 |
| JP | 4-162539 | 6/1992 |
| JP | 4-251941 | 9/1992 |
| JP | 4-326734 | 11/1992 |
| JP | 5-121453 | 5/1993 |
| JP | 9-321061 | 12/1997 |

OTHER PUBLICATIONS

Office Action from Japanese Patent Office mailed Dec. 17, 2002 in Application No. 2000–219108, translation and prior art information list containing explanation of relevance of cited references, (partical).

* cited by examiner

Primary Examiner—Mary Wilczewsid
Assistant Examiner—Monica Lewis
(74) Attorney, Agent, or Firm—Westerman, Hattori, Daniels & Adrian, LLP

(57) ABSTRACT

There is provided a compound semiconductor device that comprises a substrate formed of a first compound semiconductor, a graded channel layer formed on the substrate and formed of a second compound semiconductor layer, that lowers mostly an energy band gap in its inside by continuously changing a mixed-crystal ratio in a thickness direction such that a peak of the mixed-crystal ratio of one constituent element is positioned in its inside, and containing an impurity, a barrier layer formed on the graded channel layer, a gate electrode formed on the barrier layer, and source/drain electrodes for flowing a current into the graded channel layer. Accordingly, the compound semiconductor device having MESFET, that has the maximum mutual conductance and can make the change in the mutual conductance gentle in response to the gate voltage, can be obtained.

7 Claims, 6 Drawing Sheets

FIG. 1A
(Prior Art)
FIG. 1B
(Prior Art)
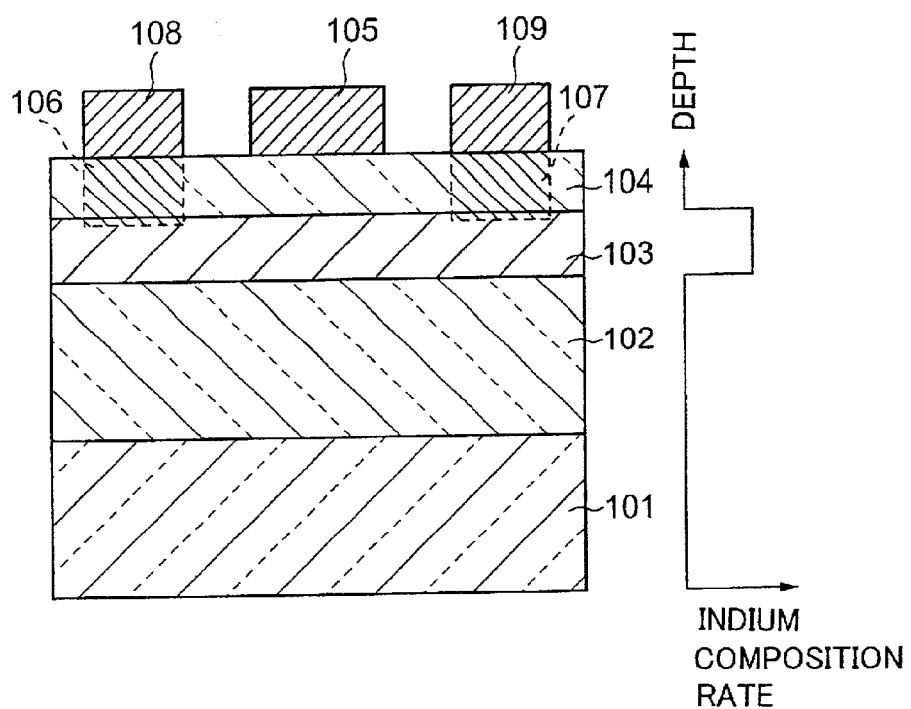
FIG. 2 (Prior Art)
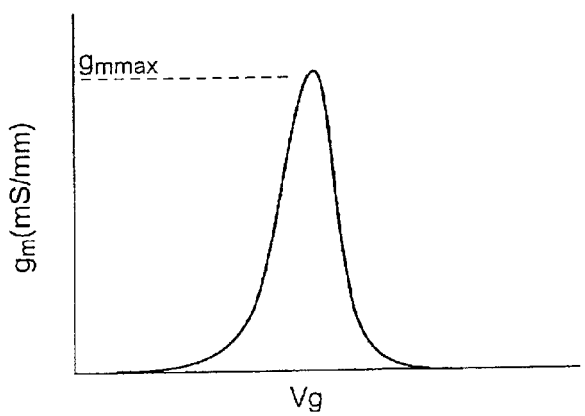

COMPOUND SEMICONDUCTOR DEVICE HAVING A MESFET THAT RAISES THE MAXIMUM MUTUAL CONDUCTANCE AND CHANGES THE MUTUAL CONDUCTANCE

BACKGROUND OF THE INVENTION

1. Field of the Invention

The present invention relates to a compound semiconductor device and, more particularly, a compound semiconductor device having a MESFET.

2. Description of the Prior Art

It is known that, since InGaAs has the large electron mobility, such InGaAs is employed as the channel layer of the MESFET (Metal Semiconductor FET).

The MESFET having the InGaAs channel layer has the structure shown in FIG. 1A, for example.

In FIG. 1A, a GaAs buffer layer 102, an n-InGaAs channel layer 103, and a GaAs barrier layer 104 are formed on a semi-insulating GaAs substrate 101, and a gate electrode 105 is formed on the GaAs barrier layer 104. The gate electrode 105 comes into Schottky-contact with the GaAs barrier layer 104.

Also, a source region 106 and a drain region 107 as high impurity concentration regions are formed in the GaAs barrier layer 104 on both sides of the gate electrode 105. A source electrode 108 and a drain electrode 109 are formed on the source region 106 and the drain region 107 to come into ohmic-contact with them respectively.

It is normal to grow InGaAs constituting the channel layer 103 without change in the conditions. An indium (In) composition ratio is constant along the layer thickness direction, as shown in FIG. 1B. Various improvements are applied to the MESFET having such InGaAs channel layer. For example, the MESFET having the structure in which the impurity doped InGaAs channel layer is sandwiched between graded InGaAs layers, or the structure that has the InGaAs channel layer having the thickness smaller than the critical thickness is known. Where the graded InGaAs layer means that the In composition ratio is changed in the layer thickness direction.

In this manner, the MESFET having the structure, in which the InGaAs channel layer is sandwiched between the graded InGaAs layers, is set forth in Patent Application Publication (KOKAI) Hei 9-321061, Patent Application Publication (KOKAI) Hei 4-326734, and Patent Application Publication (KOKAI) Hei 4-251941, for example. In Patent Application Publication (KOKAI) Hei 4-251941, the planar doping is applied to the InGaAs channel layer.

Also, the MESFET having the structure, which has the InGaAs channel layer having the thickness smaller than the critical thickness, is set forth in Patent Application Publication (KOKAI) Sho 63-272080, and Patent Application Publication (KOKOKU) Hei 6-71011, for example.

By the way, when a relationship between a gate voltage and a mutual conductance of the MESFET having the above structure in the prior art is examined, the MESFET exhibits such a characteristic that, as shown in FIG. 2, the mutual conductance ($g_m$) is changed very steeply as a function of gate voltage ($V_g$). Accordingly, the mutual conductance ($g_m$) is ready to change due to the fluctuation of the gate voltage or the reduction in the gate voltage and thus the FET characteristic becomes worse.

In addition, if the GaAs barrier layer 104 shown in FIG. 1A is undoped, a source resistance is increased and the maximum mutual conductance ($g_{mmax}$) is not increased.

Since the mutual conductance has an influence on the gain and the maximum oscillation frequency of the MESFET, normally the larger one is preferable.

SUMMARY OF THE INVENTION

It is an object of the present invention to provide a compound semiconductor device having the MESFET that raises the maximum mutual conductance and changes the mutual conductance as a function of the gate voltage gently, not to sacrifice the transistor characteristics.

According to the present invention, the ternary or quaternary compound semiconductor layer, in which the inside of the energy band gap is smaller than the edge of that by setting the peak of the mixed-crystal ratio of one constituent element in the inside of the layer, is employed as constituent element of the channel layer into which the impurity is doped.

According to this, the peak of the carrier density distribution is set to position into the inside not the surface of the channel layer. Therefore, even if the fluctuation of the gate voltage, the reduction of the gate voltage, etc. is caused, the steep increase/decrease of the carrier density in the channel layer is suppressed and also the mutual conductance that is higher and more stable than the prior art is obtained. The carrier density distribution is changed by adjusting not only the mixed-crystal ratio of the constituent element in the channel layer but also the dosage distribution of the impurity in the channel layer.

Also, since the mixed-crystal ratio distribution of the above element contained in the graded channel layer is gradually and continuously changed like the parabolic profile, for example, crystal distortion is relaxed and thus the high electron mobility is assured in the channel layer. Also, the carrier density to get the sufficient current amount is assured. In addition, since the impurity is doped into the channel layer, the increase of the source resistance is suppressed and also the maximum value of the mutual conductance is increased higher.

Also, the peak of the carrier density distribution in the channel layer is shifted toward the substrate side from the center of the thickness of the channel layer. Therefore, the distance between the depletion layer generated in the barrier layer on the channel layer and the peak of the carrier density distribution is optimized to improve the breakdown voltage characteristic under the gate electrode.

BRIEF DESCRIPTION OF THE DRAWINGS

FIG. 1A is a sectional view showing a structure of the MESFET in the prior art, and FIG. 1B is a view showing an indium distribution in a group III-V semiconductor layer constituting the MESFET in FIG. 1A;

FIG. 2 is a view showing a relationship between a gate voltage and a mutual conductance of the MESFET in the prior art;

DESCRIPTION OF THE PREFERRED EMBODIMENTS

Embodiments of the present invention will be explained with reference to the accompanying drawings hereinafter.

(First Embodiment)

Figure 3:
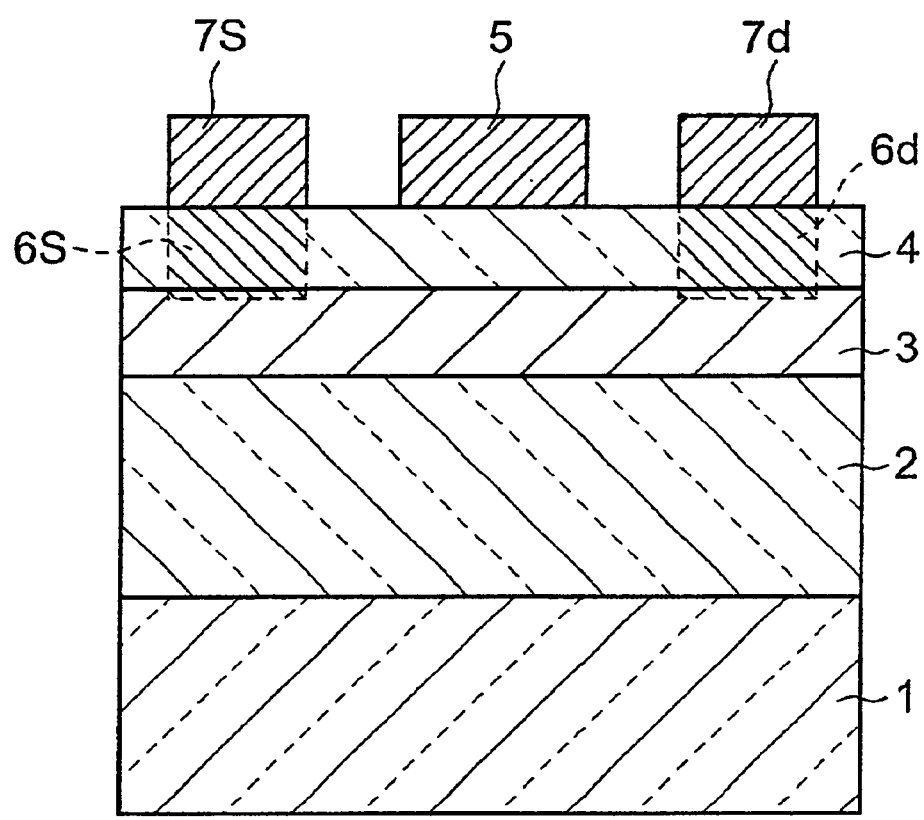
FIG. 3 is a sectional view showing a MESFET according to a first embodiment of the present invention.

FIG. 3 is a sectional view showing a MESFET according to a first embodiment of the present invention.

In FIG. 3, an undoped buffer layer 2 of GaAs is formed on a semi-insulating GaAs substrate 1 to have a thickness of 1 μm, for example.

Figure 4A:
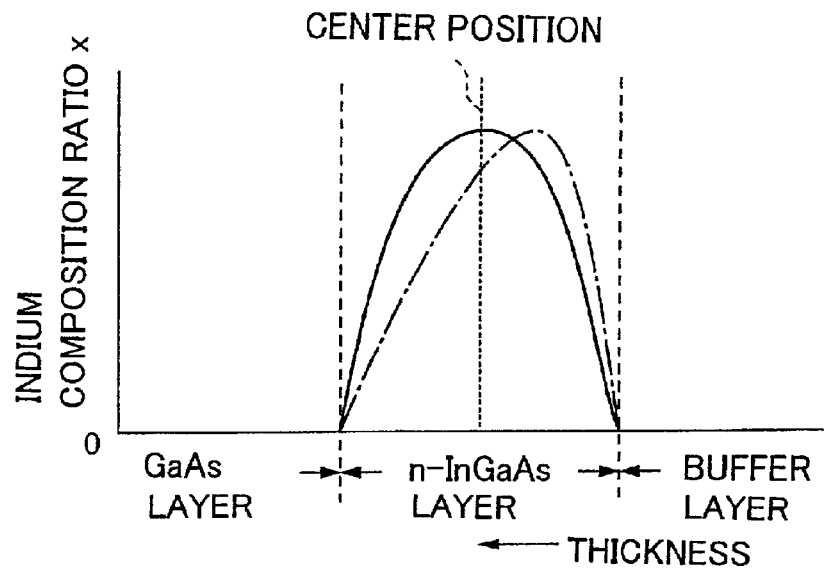
FIG. 4A is a view showing an indium distribution in an InGaAs layer constituting a channel layer of the MESFET according to the first embodiment of the present invention.

Also, a graded channel layer 3 formed of a $In_xGa_{1-x}As$ layer, into which an n-type impurity (e.g., silicon) is doped, is formed on the buffer layer 2 to have a thickness of 15 to 30 nm, for example. In this $In_xGa_{1-x}As$ layer constituting the graded channel layer 3, an In composition ratio x is changed in the graded manner along the film thickness direction, as shown in FIG. 4A. This graded channel layer 3 acts as a distortion layer for the buffer layer and a barrier layer 4, described later.

The In composition ratio x is changed continuously such that it forms a parabolic profile whose maximum value (peak) is positioned at the center of the layer thickness of the graded channel layer 3, as indicated by a solid line in FIG. 4A, or it forms the parabolic profile whose maximum value is positioned at the position deviated from the center in the graded channel layer 3, as indicated by a dot-dash line in FIG. 4A. The maximum value of the composition ratio x is not limited, but it may be set to 0.8 to 1.0 or $0.8 \leq x < 1$, for example.

Figure 4B:
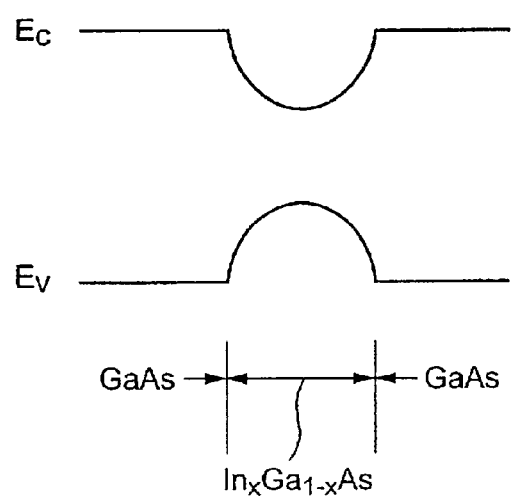
FIG. 4B shows an example of a band gap of the InGaAs layer having such indium distribution.

In the case that the peak of the In composition ratio x of the graded channel layer 3 is positioned at the center of the layer thickness and the impurity concentration is set uniformly, an energy band gap of the graded channel layer 3 and its periphery becomes smallest at the center of the graded channel layer 3, as shown in FIG. 4B.

Figure 5:
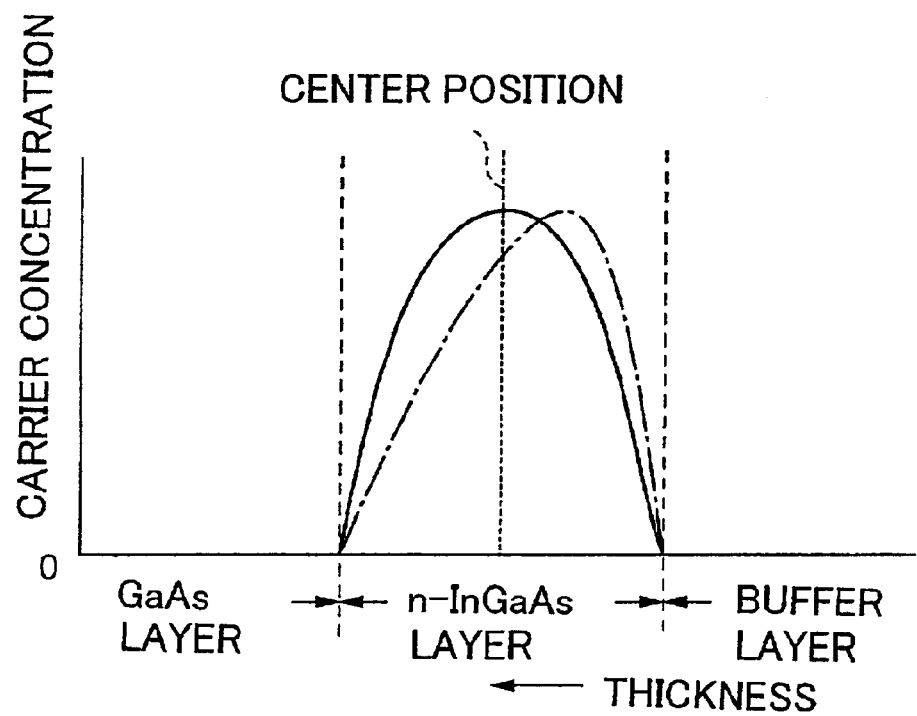
FIG. 5 is a view showing a distribution of an impurity concentration doped into the channel layer of the MESFET according to the first embodiment of the present invention.

Also, a carrier (electron) concentration in the graded channel layer 3 has a distribution whose maximum value (peak) is positioned at the center of the graded channel layer 3, as indicated by a solid line in FIG. 5, or a distribution whose maximum value (peak) is positioned at the position deviated from the center, as indicated by a dot-dash line in FIG. 5. The distribution of the carrier density can be adjusted by not only an indium mixed-crystal ratio distribution in the graded channel layer 3 but also an amount of doped impurity in the graded channel layer 3.

Accordingly, the peak position of the carrier density distribution is not always set to coincide with the peak position of the indium mixed-crystal ratio distribution.

A necessary shift length (cm) of the carrier density peak from the center position of the layer thickness in the graded channel layer 3 can be calculated by a following equation (1).

$$a = (2\epsilon V_p/qN_{da})^{1/2} - (2\epsilon V_p/qN_{dp})^{1/2} \quad (1)$$

In the equation (1), $\epsilon$ is the dielectric constant, $V_p$ is the pinch-off voltage, q is the charge amount of electron, $N_{da}$ is the average carrier density of the distortion layer, and $N_{dp}$ is the peak carrier density. Here, $\epsilon = 12.85 + 1.64x$ (x is the indium mixed-crystal ratio), and $q = 1.6 \times 10^{-19}$.

The barrier layer 4 made of undoped GaAs or n-type GaAs is formed on such graded channel layer 3, and a gate electrode 5 made of tungsten (W) or tungsten silicide (WSi) is formed thereon. The gate electrode 5 comes into Schottky-contact with the barrier layer 4, and the depletion layer extends into the graded channel layer 3 from the contact portion. A depth of the depletion layer can be changed by changing the voltage value applied to the gate electrode 5.

Also, high concentration impurity regions 6s, 6d are formed on the barrier layer 4 in both sides of the gate electrode 5 by the impurity thermal diffusing method or the ion implantation method. Then, a source electrode 7s is formed on one high concentration impurity region 6s, while a drain electrode 7d is formed on the other high concentration impurity region 6d. Each of the source electrode 7s and the drain electrode 7d is constructed as a triple-layered structure that is formed by laminating a gold germanium layer, a nickel layer, and a gold layer in sequence from the bottom. The source electrode 7s and the drain electrode 7d is ohmic-connected to the barrier layer 4.

Respective layers from the buffer layer 2 to the channel barrier layer 4 may be formed by the molecular-beam epitaxial crystal growth method, the MOCVD method, etc., for example.

Then, the graded channel layer 3 is to be grown, the indium mixed-crystal ratio distribution that is changed continuously, as shown in FIG. 4A, is obtained by gradually changing an indium irradiation amount or an indium source gas (for example trimethylindium) flow rate. The dosage of silicon in the graded channel layer 3 is controlled by changing the amount of the silicon irradiation or by changing the gas flow rate of silicon source gas (for example silane).

Figure 6:
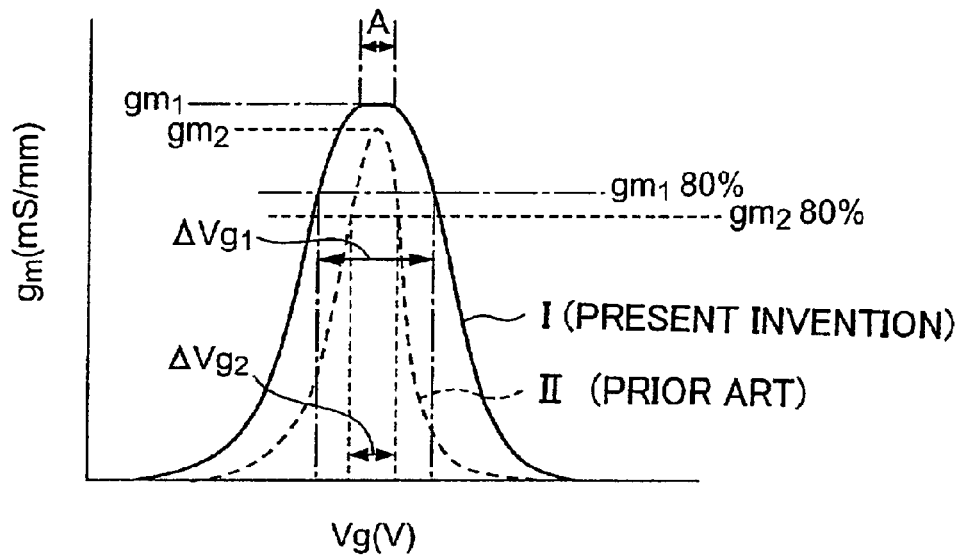
FIG. 6 is a view showing relationships between the gate voltage and the mutual conductance of the MESFET according to the first embodiment of the present invention and the MESFET in the prior art respectively.

In the MESFET having the above structure, when the relationship between the gate voltage $V_g$ and the mutual conductance $g_m$ was examined experimentally, a $V_g$-$g_m$ characteristic curve I indicated by a solid line in FIG. 6 was obtained. In FIG. 6, a broken line shows a $V_g$-$g_m$ characteristic curve II of the MESFET shown in FIG. 1A in the prior art.

In FIG. 6, in the $V_g$-$g_m$ characteristic curve I of the present invention, a substantially flat area A appears in the maximum value $g_{m1}$ of the mutual conductance $g_m$. In order to generate such flat area A, it is important to control the changes of the indium mixed-crystal ratio and the carrier density.

If the $V_g$-$g_m$ characteristic curve I of the present invention and the $V_g$-$g_m$ characteristic curve II in the prior art are compared with each other, there are following differences in addition to the difference that the maximum value of the mutual conductance is flat or acute.

A difference between a low value and a high value of $V_g$ that enable to get a 80% value of the maximum value $g_{m1}$ of the $V_g$-$g_m$ characteristic curve I according to the MESFET of the present invention is assumed as $\Delta V_{g1}$, and a difference between a low value and a high value of $V_g$ that enable to get the 80% value of the maximum value $g_{m2}$ of the $V_g$-$g_m$ characteristic curve II according to the MESFET in the prior art is assumed as $\Delta V_{g2}$. Then, if these differences are compared with each other, $\Delta V_{g1}$ is about three times $\Delta V_{g2}$, and the mutual conductance of the MESFET of the present invention is changed gently and stably rather than the prior art. According to the present invention, $\Delta V_{g1}$ can be enhanced up to about five times of $\Delta V_{g2}$ by adjusting the impurity concentration distribution, the indium mixed-crystal ratio, etc.

Also, according to FIG. 6, it can be found that the maximum value $g_{m1}$ of the $V_g$-$g_m$ characteristic curve I of the present invention can be increased larger than the maximum value $g_{m2}$ of the $V_g$-$g_m$ characteristic curve II in the prior art.

As a result, according to the MESFET of the present invention, a change amount of the mutual conductance is small even when the fluctuation or change of the gate voltage occurs, and thus the gain and the maximum oscillation frequency are increased and become stable. As a result, it is possible to get the stable transistor operation.

Figure 7:
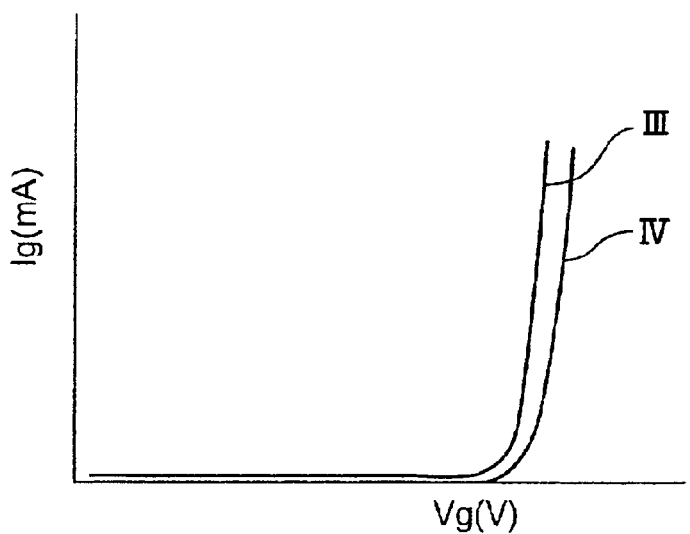
FIG. 7 is a view showing a relationship between the gate voltage and a gate current in the MESFET according to the first embodiment of the present invention.

Meanwhile, when a relationship between the gate voltage $V_g$ and a gate current $I_g$ was examined in both cases where the peak of the carrier density in the graded channel layer 3 in the layer thickness direction is positioned at the center of the layer thickness and where the peak of the carrier density is shifted toward the GaAs substrate 1 side from the center, as shown in FIG. 5, curves III and IV shown in FIG. 7 were obtained. That is, in the MESFET having the graded channel layer 3 in which the peak of the carrier density is positioned at the center of the layer thickness, as indicated by a solid line in FIG. 5, a first $V_g$–$I_g$ curve III was obtained. Also, in the MESFET having the graded channel layer 3 in which the peak of the carrier density is shifted toward the GaAs substrate 1 side from the center of the layer thickness, as indicated by a broken line in FIG. 5, a second $V_g$–$I_g$ curve IV was obtained.

According to FIG. 7, it is found that the gate voltage value at a rising point of the gate current in the second $V_g$–$I_g$ curve IV becomes larger than that in the first $V_g$–$I_g$ curve III at and thus the breakdown voltage is enhanced.

If the peak of the carrier density distribution is set close to the GaAs substrate 1 from the center of the layer thickness of the channel layer 3, the distance between the surface depletion layer and the peak position of the carrier density is controlled to be separated much more, and thus the electric field concentration caused on the drain end side under the gate electrode 5 can be relaxed. Therefore, the breakdown voltage of the graded channel layer 3 can be enhanced.

In this case, the magnitude of the average value of the carrier density in the graded channel layer 3 is set to get the necessary current.

In the above graded channel layer 3, since the distribution of indium is gradually changed, crystal distortion is relaxed and thus the high electron mobility can be assured. Also, the carrier density to get the sufficient current can be assured. In addition, since an undoped layer is not interposed in the graded channel layer 3, the increase of the source resistance can be suppressed and also the higher maximum value of the mutual conductance can be obtained. Further, since the sudden increase/decrease of the carrier density can be suppressed in the graded channel layer 3 even if the variation of the gate voltage is caused, the flat and stable mutual conductance can be obtained.

As described above, according to the MESFET of the first embodiment, the maximum mutual conductance can be set higher not to sacrifice the transistor characteristics, and also the change of the mutual conductance in response to the gate voltage becomes gentle.

(Second Embodiment)

The MESFET having the structure in which the indium mixed-crystal ratio distribution and the carrier density in the InGaAs channel layer are gradually changed is not limited to the example shown in FIG. 3.

Figure 8:
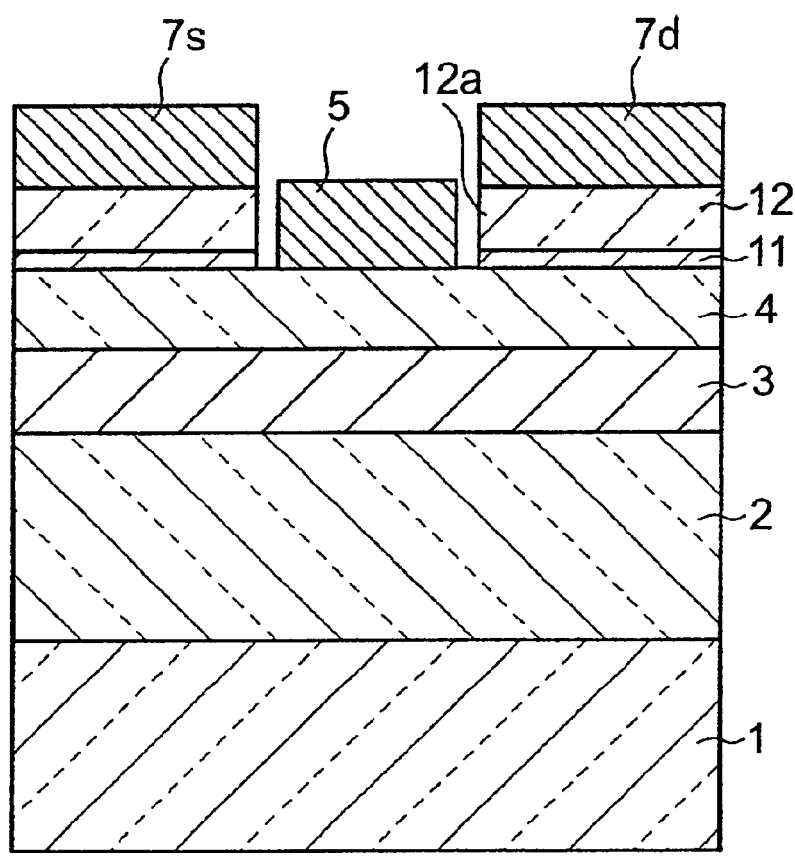
FIG. 8 is a sectional view showing a MESFET according to a second embodiment of the present invention.

For example, the present invention may be applied to a MESFET having a recess structure as shown in FIG. 8.

In FIG. 8, like the first embodiment, the buffer layer 2 made of GaAs, the graded channel layer 3 made of $In_xGa_{1-x}As$, and the barrier layer 4 made of undoped GaAs or n-type GaAs are formed in sequence on the semi-insulating GaAs substrate 1. In addition, an AlGaAs layer 11 is formed as an etching stopper layer on the barrier layer 4, and then a contact layer 12 made of high impurity concentration $n^+$-type GaAs is formed thereon.

A concave portion 12a is formed on a gate electrode forming portion in the contact layer 12 and the AlGaAs layer 11 by the etching. If the etchant that makes the selective etching of the AlGaAs layer 11 possible is employed in etching the contact layer 12 and the etchant that makes the selective etching of the GaAs barrier layer 4 possible is employed in etching the AlGaAs layer 11, the etching controllability of the contact layer 12 and the barrier layer 4 can be improved.

After the concave portion 12a is formed in such manner, a gate electrode 5 made of W or WSi is formed on the barrier layer 4 via the concave portion 12a. Then, a source electrode 7s and a drain electrode 7d made of ohmic alloy are formed on the contact layer 12 on both sides of the gate electrode 5 respectively.

In the MESFET having such structure, like the first embodiment, if the indium mixed-crystal ratio distribution in the InGaAs layer constituting the graded channel layer 3 is controlled as shown in FIG. 4A and the carrier density distribution in the graded channel layer 3 is controlled as shown in FIG. 5, it is possible to enhance the maximum mutual conductance and to render the change in the mutual conductance gentle as a function of the gate voltage rather than the MESFET of the prior art.

(Other Embodiment)

In the above embodiments, the graded channel layer formed over the GaAs substrate is formed of the InGaAs layer, but such graded channel layer may be formed of a GaAsSb layer or an InGaSb layer. If the GaAsSb layer is employed, an antimony (Sb) mixed-crystal ratio distribution is formed in the same way as the indium shown in FIG. 4A. If the InGaSb layer is employed, the indium is distributed in the same way as FIG. 4A.

Also, although the GaAs substrate is employed in the above embodiments, other compound semiconductor substrate may be employed. For example, if a InP substrate is employed, an InAsP layer, a GaAsSb layer, an InPSb layer, or the like is formed as the graded layer that is formed on the substrate. If the InAsP layer is employed, an arsenic (As) mixed-crystal ratio distribution is formed in the same way as the indium shown in FIG. 4A. Also, if the GaAsSb layer or the InPSb layer is employed, an antimony (Sb) mixed-crystal ratio distribution is formed in the same way as the indium shown in FIG. 4A.

In other words, out of a group III–V semiconductor layer constituting the channel layer, In, etc. as well as Ga may be employed as the group III element and also P or Sb as well as As may be employed as the group V element.

It is preferable that the mixed-crystal ratio should be changed as shown in FIG. 4A, for example, by including the element in which difference ΔEc in the conduction band can be set large in contrast to the compound semiconductor substrate material, i.e., the element that can reduce the energy band gap, into the channel layer.

As described above, according to the present invention, the channel layer is formed of the compound semiconductor that contains the element to reduce the conduction band energy lower than the substrate material and the mixed-crystal ratio of this element is changed like the parabolic profile along the layer thickness direction. Therefore, even if the change of the gate voltage such as the fluctuation, the reduction, etc. is caused, the sudden increase/decrease of the carrier density in the channel layer can be suppressed and also the mutual conductance that is higher and more stable than the prior art can be obtained.

Also, the peak of the carrier density distribution in the channel layer is shifted toward the substrate side from the center of the film thickness of the channel layer. Therefore, the distance between the depletion layer generated in the barrier layer on the channel layer and the peak of the carrier density distribution can be adjusted, and also the breakdown voltage characteristic under the gate electrode can be improved.

What is claim is:

1. A compound semiconductor device comprising:

a substrate formed of a first compound semiconductor;

a buffer layer formed on the substrate;

a graded channel layer formed on the buffer layer, said graded channel layer composed of a second compound semiconductor layer doped with an impurity, said second compound semiconductor layer selected from the group consisting of a $In_xGa_{1-x}As$ layer, a $GaAs_{1-x}Sb_x$ layer and a $In_xGa_{1-x}Sb$ layer (x: distribution), the distribution (x) being set to $0.8 \leq x < 1$, said distribution (x) has a peak in the inside of said graded channel layer in a thickness direction, thereby an energy band gap of the graded channel layer is made narrower in the inside than at both ends in the thickness direction;

a barrier layer formed on the graded channel layer;

a gate electrode formed on the barrier layer to come into Schottky-contact with the barrier layer; and a source electrode and a drain electrode formed on both sides of the gate electrode to flow a current into the graded channel layer via the barrier layer.

2. A compound semiconductor device according to claim 1, wherein a peak of the one constituent element in the graded channel layer is positioned at a center of a layer thickness of the graded channel layer, or positioned at a position that is deviated from the center.

3. A compound semiconductor device according to claim 1, wherein a peak of carrier density in the graded channel layer is positioned at a center of a layer thickness of the graded channel layer, or deviates from the center.

4. A compound semiconductor device according to claim 3, wherein a peak of carrier density in the graded channel layer shifts to the substrate side from a center of layer thickness of the graded channel layer.

5. A compound semiconductor device according to claim 1, wherein contact layers are formed between the source electrode and the barrier layer and between the drain electrode and the barrier layer respectively.

6. A compound semiconductor device according to claim 1, wherein the first compound semiconductor constituting the substrate is GaAs.

7. A compound semiconductor device comprising:

a substrate formed of a first compound semiconductor;

a buffer layer formed on the substrate;

a graded channel layer formed on the buffer layer, said graded channel layer composed of a second compound semiconductor layer doped with an impurity of which one constituent element of said second compound semiconductor layer has a peak distribution in the inside of said graded channel layer in a thickness direction, thereby an energy band gap of the graded channel layer is made narrower in the inside than at both ends in the thickness direction;

a barrier layer formed on the graded channel layer;

a gate electrode formed on the barrier layer to come into Schottky-contact with the barrier layer; and a source electrode and a drain electrode formed on both sides of the gate electrode to flow a current into the graded channel layer via the barrier layer, wherein the first compound semiconductor constituting the substrate is InP, and the second compound semiconductor layer constituting the graded channel layer is an InAsP or a GaAsSb or an InPSb, and one constituent element contained in the second compound semiconductor layer is indium or antimony.

* * * * *